United States Patent
Bolotov et al.

(10) Patent No.: US 8,996,969 B2
(45) Date of Patent: Mar. 31, 2015

(54) LOW DENSITY PARITY CHECK DECODER WITH MISCORRECTION HANDLING

(71) Applicant: LSI Corporation, Milpitas, CA (US)

(72) Inventors: Anatoli A. Bolotov, San Jose, CA (US); Shaohua Yang, San Jose, CA (US); Zongwang Li, San Jose, CA (US); Mikhail I Grinchuk, San Jose, CA (US); Lav D. Ivanovic, Sunnyvale, CA (US); Fan Zhang, Milpitas, CA (US); Yang Han, Sunnyvale, CA (US)

(73) Assignee: LSI Corporation, Milpitas, CA (US)

( * ) Notice: Subject to any disclaimer, the term of this patent is extended or adjusted under 35 U.S.C. 154(b) by 145 days.

(21) Appl. No.: 13/708,941

(22) Filed: Dec. 8, 2012

(65) Prior Publication Data

US 2014/0164866 A1 Jun. 12, 2014

(51) Int. Cl.
*H03M 13/00* (2006.01)
*H03M 13/13* (2006.01)
*H03M 13/11* (2006.01)

(52) U.S. Cl.
CPC .......... *H03M 13/13* (2013.01); *H03M 13/1111* (2013.01); *H03M 13/1142* (2013.01)
USPC ............................ 714/785; 714/752; 714/758

(58) Field of Classification Search
CPC ...................... H03M 13/151; H03M 13/15
USPC .......... 714/785, 758, 752, 776, 794, 780, 764
See application file for complete search history.

(56) References Cited

U.S. PATENT DOCUMENTS

| | | |
|---|---|---|
| 5,701,314 A | 12/1997 | Armstrong |
| 5,712,861 A | 1/1998 | Inoue |
| 6,438,717 B1 | 8/2002 | Butler |
| 6,657,803 B1 | 12/2003 | Ling |
| 7,136,244 B1 | 11/2006 | Rothberg |
| 7,702,989 B2 | 4/2010 | Graef et al. |
| 7,730,384 B2 | 6/2010 | Graef et al. |
| 7,738,201 B2 | 6/2010 | Jin et al. |
| 7,827,461 B1 | 11/2010 | Low et al. |
| 7,971,125 B2 | 6/2011 | Graef et al. |
| 7,990,642 B2 | 8/2011 | Lee et al. |
| 8,018,937 B2 * | 9/2011 | Epps et al. ................... 370/392 |
| 8,176,404 B2 | 5/2012 | Yang et al. |
| 2010/0042890 A1 | 2/2010 | Gunnam et al. |

(Continued)

OTHER PUBLICATIONS

Kang et al., "A Two-Stage Iterative Decoding of LDPC Codes for Lowering Error Floors", IEEE GLOBECOM Proceedings, 1088-1091 (2008).

(Continued)

*Primary Examiner* — Fritz Alphonse
(74) *Attorney, Agent, or Firm* — Hamilton DeSanctis & Cha

(57) ABSTRACT

A data processing system includes a decoder circuit, syndrome calculation circuit and hash calculation circuit. The decoder circuit is operable to apply a decoding algorithm to a decoder input based on a first portion of a composite matrix to yield a codeword. The syndrome calculation circuit is operable to calculate a syndrome based on the codeword and on the first portion of the composite matrix. The hash calculation circuit is operable to calculate a hash based on a second portion of the composite matrix. The decoder circuit is also operable to correct the codeword on the hash when the syndrome indicates that the codeword based on the first portion of the composite matrix is correct but a second test indicates that the codeword is miscorrected.

20 Claims, 6 Drawing Sheets

(56) References Cited

U.S. PATENT DOCUMENTS

| | | | |
|---|---|---|---|
| 2010/0257434 A1* | 10/2010 | Harrison et al. | 714/785 |
| 2011/0080211 A1 | 4/2011 | Yang | |
| 2011/0161633 A1 | 6/2011 | Xu | |
| 2012/0005551 A1 | 1/2012 | Gunnam et al. | |
| 2012/0200954 A1 | 8/2012 | Jin | |
| 2012/0236429 A1 | 9/2012 | Yang | |
| 2013/0054217 A1* | 2/2013 | Gullapalli et al. | 703/14 |

OTHER PUBLICATIONS

Lin et al "An efficient VLSI Architecture for non binary LDPC decoders"—IEEE Transaction on Circuits and Systems II vol. 57, Issue 1 (Jan. 2010) pp. 51-55.

Olmos et al., "Tree-Structure Expectation Propagation for LDPC Decoding in Erasure Channels", Cornell University Library arXiv:1009.4287 (Sep. 22, 2010).

Perisa et al "Frequency Offset Estimation Based on Phase Offsets Between Sample Correlations" Dept. of Info. Tech. University of Ulm 2005.

U.S. Appl. No. 13/490,849, Unpublished (filed Jun. 7, 2012) (Johnson Yen).

U.S. Appl. No. 13/465,214, Unpublished (filed May 7, 2012) (Chung-Li Wang).

U.S. Appl. No. 13/445,858, Unpublished (filed Apr. 12, 2012) (Johnson Yen).

U.S. Appl. No. 13/459,282, Unpublished (filed Apr. 30, 2012) (Fan Zhang).

U.S. Appl. No. 13/412,492, Unpublished (filed Mar. 5, 2012) (Shaohua Yang).

U.S. Appl. No. 13/326,367, Unpublished (filed Dec. 15, 2011) (Shaohua Yang).

U.S. Appl. No. 13/326,363, Unpublished (filed Dec. 15, 2011) (Fan Zhang).

U.S. Appl. No. 13/372,600, Unpublished (filed Feb. 14, 2012) (Shaohua Yang).

U.S. Appl. No. 13/483,982, Unpublished (filed May 30, 2012) (Yang Han).

U.S. Appl. No. 13/474,672, Unpublished (filed May 17, 2012) (Fan Zhang).

U.S. Appl. No. 13/611,158, Unpublished (filed Sep. 12, 2012) (Yang Han).

U.S. Appl. No. 13/560,737, Unpublished (filed Jul. 27, 2012) (Weijun Tan).

U.S. Appl. No. 13/363,751, Unpublished (filed Feb. 1, 2012) (Lei Chen).

U.S. Appl. No. 13/284,754, Unpublished (filed Oct. 28, 2011) (Fan Zhang).

U.S. Appl. No. 13/602,440, Unpublished (filed Sep. 4, 2012) (Fan Zhang).

U.S. Appl. No. 13/644,542, Unpublished (filed Oct. 4, 2012) (Shaohua Yang).

U.S. Appl. No. 13/644,589, Unpublished (filed Oct. 4, 2012) (Shaohua Yang).

U.S. Appl. No. 13/450,289, Unpublished (filed Apr. 18, 2012) (Shaohua Yang).

U.S. Appl. No. 13/452,733, Unpublished (filed Apr. 20, 2012) (Shaohua Yang).

U.S. Appl. No. 13/624,927, Unpublished (filed Sep. 22, 2012) (Shaohua Yang).

U.S. Appl. No. 13/426,722, Unpublished (filed Mar. 22, 2012) (Fan Zhang).

U.S. Appl. No. 13/645,838, Unpublished (filed Oct. 5, 2012) (Chung-Li Wang).

U.S. Appl. No. 13/468,968, Unpublished (filed May 10, 2012) (Sancar K. Olcay).

Cavus et al "A Performance Improvement and Error Floor Avoidance Technique for Belief Propagation Decoding of LDPC Codes" Personal, Indoor and Mobile Radio Communication, Sep. 2005.

\* cited by examiner

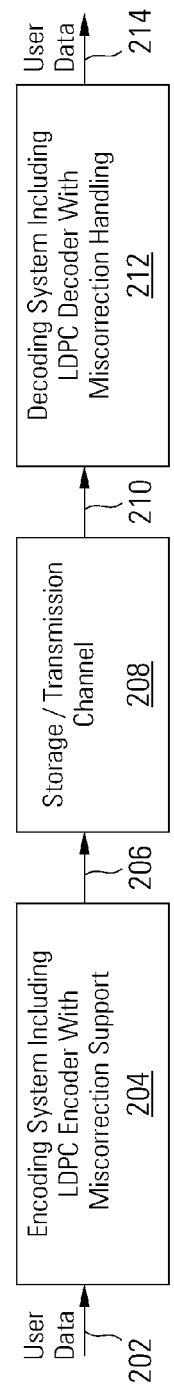
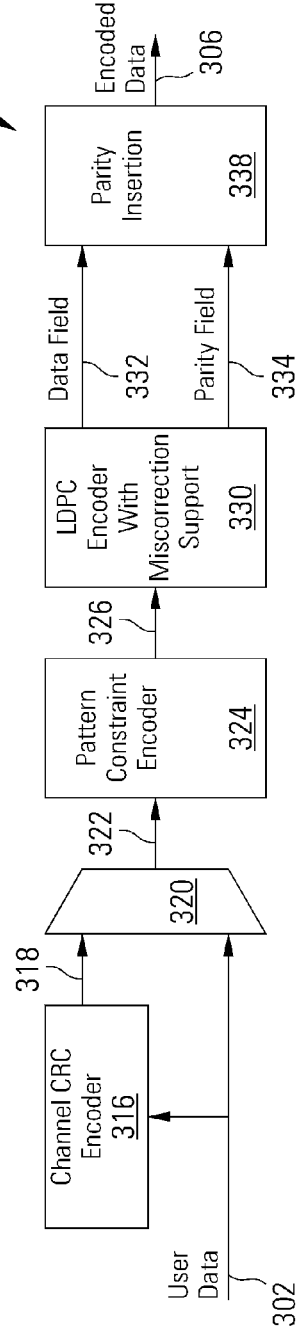

LOW DENSITY PARITY CHECK DECODER WITH MISCORRECTION HANDLING

FIELD OF THE INVENTION

Various embodiments of the present inventions provide apparatuses and methods for low density parity check decoding with miscorrection handling.

BACKGROUND

Various data transfer systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. In some cases, the data processing function receives data sets and applies a data decode algorithm to the data sets to recover an originally written data set. In some cases, application of the data decoding process provides a correct result for internal decoder metrics suggesting that the result is correct when in fact it is not. Such miscorrections can be difficult to detect and may be fatal to the operation of a recipient device.

SUMMARY

A data processing system is disclosed including a decoder circuit, syndrome calculation circuit and hash calculation circuit. The decoder circuit is operable to apply a decoding algorithm to a decoder input based on a first portion of a composite matrix to yield a codeword. The syndrome calculation circuit is operable to calculate a syndrome based on the codeword and on the first portion of the composite matrix. The hash calculation circuit is operable to calculate a hash based on a second portion of the composite matrix. The decoder circuit is also operable to correct the codeword on the hash when the syndrome indicates that the codeword based on the first portion of the composite matrix is correct but a second test indicates that the codeword is miscorrected.

This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

FIG. 1 depicts a generator matrix and a corresponding parity check matrix, including a truncated sub-matrix H and a special layer S in accordance with one or more embodiments of the present invention;

FIG. 2 depicts a data processing system with an encoding system and a decoding system, including a low density parity check decoder with miscorrection handling in accordance with one or more embodiments of the present invention;

FIG. 3 depicts an encoding system including a low density parity check encoder with miscorrection support in accordance with one or more embodiments of the present invention;

DETAILED DESCRIPTION OF THE INVENTION

Figure 4:
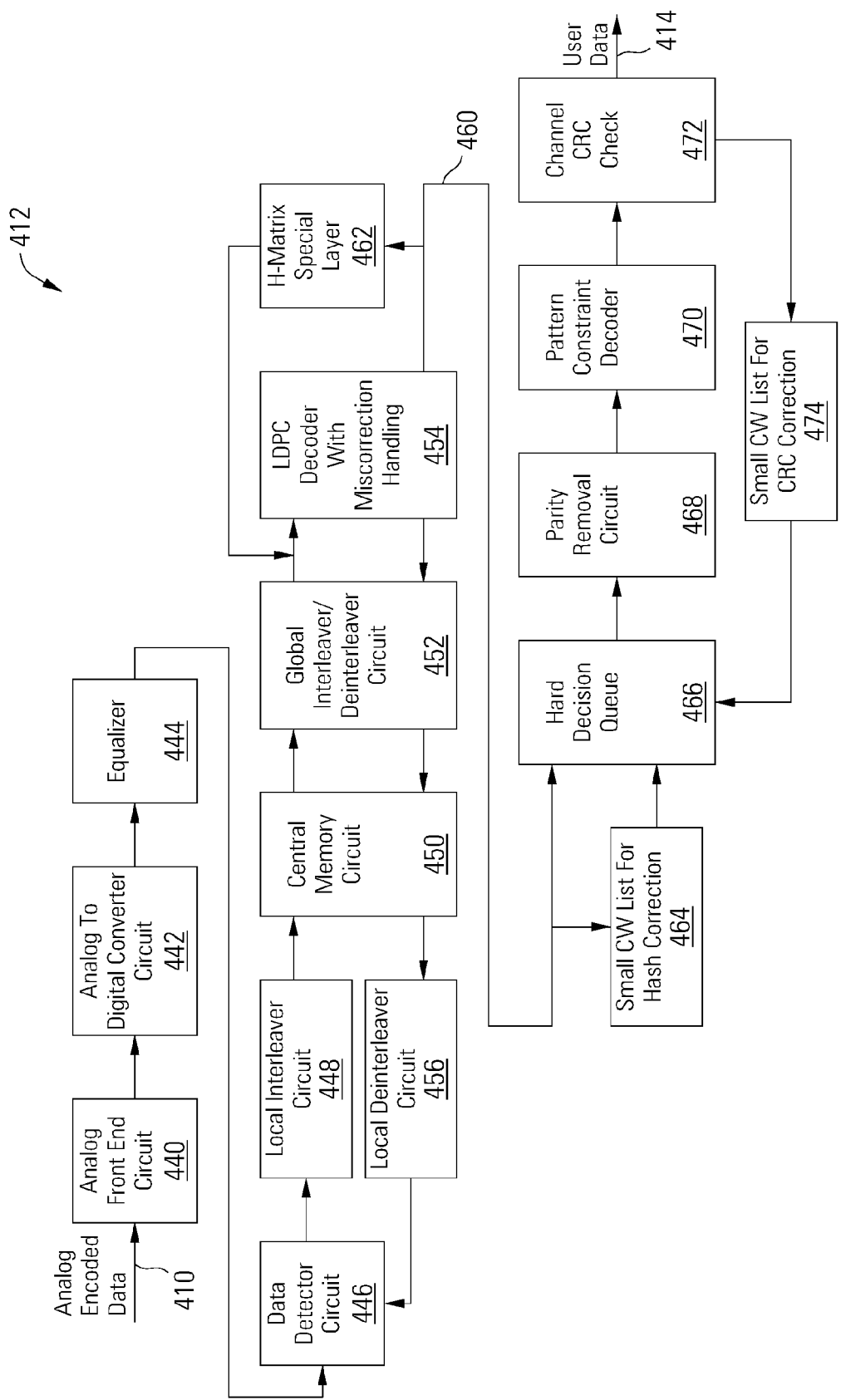
FIG. 4 depicts a decoding system including a low density parity check decoder with miscorrection handling in accordance with one or more embodiments of the present invention.

A low density parity check (LDPC) decoder with miscorrection handling uses a special layer S added to the parity-check $H_0$ matrix to assist in detecting and solving miscorrections, in which the decoder has converged on an incorrect codeword. A generator matrix G 100 is applied in a low density parity check encoder with miscorrection support, yielding a parity check H matrix 102 including a truncated sub-matrix $H_0$ 104 and special layer S 106 that is used in a low density parity check decoder with miscorrection handling to decode a codeword or encoded data as depicted in FIG. 1. The parity check H matrix 102 is also referred to herein as a composite matrix. The sub-matrix $H_0$ 104 corresponds to user data bits and parity bits and defines connections between variable nodes and check nodes in the low density parity check decoder. The sub-matrix $H_0$ 104 may be, but is not limited to, a standard low density parity check parity check or H matrix that is used by a low density parity check decoder to apply a low density parity check algorithm to a codeword. The sub-matrix $H_0$ 104 may be any H matrix known in the art or otherwise, and one of ordinary skill in the art will recognize a variety of H matrices that may be used in relation to different embodiments of the present inventions, such as binary and non-binary, quasi-cyclic, etc. On the decoder side, the special layer S 106 has, but is not limited to, the same structure as the sub-matrix $H_0$ 104, adding more parity bits. In some embodiments, the special layer S 106 is more dense than the sub-matrix $H_0$ 104. On the encoder side, this leads to a size increase for the generator matrix G 100.

The special layer S 106 is used when the data has converged, which is identified in some embodiments when the syndrome is 0, that is, the vector obtained by multiplying the hard decision outcome V of the low density parity check decoding based on the sub-matrix $H_0$ by the sub-matrix $H_0$ equals 0. (Syndrome=sub-matrix $H_0$×hard decision or corrected codeword V.) The special layer S 106 is used in some embodiments for two purposes. In one of the two purposes, referred to herein as the inner level, the special layer S 106 is used to perform extra low density parity check decoding based on the full H matrix 102 when the syndrome, computed using only the sub-matrix $H_0$ 104, is 0 but other tests such as, but not limited to, a cyclic redundancy check (CRC) indicate that the data has been miscorrected and that the hard decisions contain errors. In another of the two purposes, referred to herein as the outer level, the special layer S 106 is also used to compute a hash value in the low density parity check encoder, to check the hash value in the low density parity check decoder, and to attempt to correct a miscorrected codeword using small codewords based on the hash value. The hash value is used to identify small precalculated codewords or sub-codewords that can be added to the miscorrected codeword to correct it. In other embodiments, the special layer S 106 is used for just one of these purposes.

In the inner level of miscorrection handling, the low density parity check decoding is initially performed using the sub-matrix $H_0$ 104, with the special layer S 106 disabled or unused. If the syndrome is zero, meaning that the low density parity check decoder has determined that the data has converged and that decoding is complete, but another test indicates that the data has been miscorrected, the low density parity check decoding is repeated using the full H matrix 102, including both the sub-matrix $H_0$ 104 and the special layer S 106. Notably, the full syndrome for the full H matrix 102 is the concatenation of the syndrome and the hash. In some embodiments, the miscorrection is detected by calculating the hash value after the low density parity check decoding is complete with syndrome=0, and if the hash value is not 0, a miscorrection has occurred. In some embodiments, miscorrection detection also includes performing a cyclic redundancy check test if the hash value is 0, using external cyclic redundancy check bits incorporated into user or controller bits in the data being decoded. Based upon the disclosure provided herein, one of ordinary skill in the art will recognize other miscorrection detection techniques that could be used in relation to different embodiments of the present invention. If, after repeating the low density parity check decoding using the full H matrix 102, there is still an indication of miscorrection via hash, external cyclic redundancy check or other data integrity test, control is passed in some embodiments to the outer level of miscorrection handling.

In the outer level of miscorrection handling, for a given hash value, a small codeword is retrieved from a lookup table or otherwise obtained based on the hash value. Each hash value may retrieve zero, one or more small codewords. One or more codewords may even be retrieved with a hash value of 0, which may occur when the miscorrection is detected using an external cyclic redundancy check or other data integrity test despite a hash value of 0. The small codewords are pre-computed for the sub-matrix $H_0$ 104. Each retrieved small codeword is applied to the miscorrected codeword produced by the low density parity check decoding to determine if the application corrects the miscorrected codeword. In some embodiments, each small codeword is combined with the miscorrected codeword using an exclusive-or (XOR) operation. If the syndrome of the resulting codeword is 0, the resulting codeword is the corrected codeword. By using a hash that satisfies the linearity property, the hash value and the small codeword can be used to edit and correct the miscorrected decoded codeword. The linearity property specifies that HASH (A XOR B)=HASH(A) XOR HASH(B), for any binary vectors A and B. In particular, if for decoded codeword A, a small codeword B is found with the same hash value, and the codeword A XOR codeword B results in HASH=0, this means that applying the small codeword to the miscorrected codeword results in a codeword for the full H matrix 102 and not only for the sub-matrix $H_0$ 104 as it was before correction, because if HASH(A)=HASH(B), HASH(A) XOR HASH(B) =0. In embodiments without the linearity property for the hash values, every small codeword is tested and the cyclic redundancy check is recomputed for the corrected codeword.

The outer level of miscorrection handling is based on the assumptions that the miscorrection is caused by low-weight codewords, the weight of which is close to the minimum distance of the low density parity check code, and that a list of such low-weight codewords is available and of manageable size for the low density parity check decoder with miscorrection handling.

Again, the small codewords are pre-computed for the sub-matrix $H_0$ 104. When generating sub-matrix $H_0$ 104 at design time, the small codewords are also generated, along with their hash values. The hash value and small codeword pairs are stored in a lookup table or are otherwise made available to the low density parity check decoder. In some embodiments, the design time selection of small codewords to be made available for retrieval and use during low density parity check decoding is based at least in part on identifying those small codewords that cause miscorrection during extensive design simulations of the low density parity check decoder. The small codewords may be made available to the low density parity check decoder in any suitable manner, including but not limited to a lookup table in a memory accessible by the low density parity check decoder. Based upon the disclosure provided herein, one of ordinary skill in the art will recognize other ways in which the small codeword and hash pairs may be made available to the low density parity check decoder that could be used in relation to different embodiments of the present invention.

In some embodiments using quasi-cyclic parity check matrices the codewords are partitioned into classes of cyclically equivalent words. In an embodiment where the special layer S has the same cyclic structure and its height divides the size of the circulant, in other words where the hash bit length divides the circulant size, the look-up table contains only one hash value for each class of equivalent codewords, reducing the size of the hash and small codeword pairs significantly. In embodiments with non-binary low density parity check quasi-cyclic matrices the number of stored pairs can be reduced in a similar manner, taking into account Galois Field multiplicity for codewords. In the embodiments with quasi-cyclic or Galois Field equivalence in which codewords are transformed, the hash values are equivalently transformed. Thus, for an equivalent codeword the hash value is not recomputed, rather, the hash value is obtained by a simple quasi-cyclic transformation and/or Galois Field multiplication of a known hash value already computed for the codeword from the same class. This can significantly reduce the number of stored pairs. To preserve uniqueness of stored pairs, in some embodiments the lowest hash value among all equivalent codewords from the same class is used in the lookup table as representative for the entire class of equivalence.

The hash values are computed based on the special layer S 106 and are included as extra parity bits in the data to be decoded. In some embodiments, the hash value is calculated in the low density parity check decoder in the same manner as the syndrome, with the syndrome calculated based on the sub-matrix $H_0$ 104, excluding the special layer S 106, and with the hash value calculated based on the special layer S 106, excluding the sub-matrix $H_0$ 104. The hash is thus calculated as the hard decision outcome for the special layer S 106 multiplied by the special layer S. (Hash=special layer S×hard decision or corrected codeword for the special layer S.)

The low density parity check encoding is performed based on the generator matrix G 100, corresponding to the full H matrix 102. The hash value thus corresponds to the extra parity bits associated with the special layer S 106. In some other embodiments, rather than increase the number of parity bits with the special layer S 106, the amount of regular channel cyclic redundancy check data generated and transmitted from the encoder to the decoder is reduced.

Given a pre-selected special layer S 106, hash values S*C are computed for each small codeword C that is generated. Because miscorrection typically occurs due to a small codeword or section of the overall codeword, a miscorrection in decoding does not yield correct codeword D, but miscorrected codeword E which equals D XOR C for some small codeword C. By retrieving small codeword C from a lookup table using the hash value and applying correction E XOR C=D XOR C XOR C=D, the correct codeword D is obtained.

After the inner level and outer level of miscorrection handling has been performed, additional tests can be performed on the corrected codeword from the outer level of miscorrection handling, such as, but not limited to, an external cyclic redundancy check test, and if the corrected codeword is still not correct, additional correction techniques may be invoked.

Turning to FIGS. 2-4, a data processing system is shown in accordance with various embodiments of the present invention. A data processing system with an encoding system and a decoding system, including a low density parity check decoder with miscorrection handling, is depicted in FIG. 2 in accordance with one or more embodiments of the present invention. The data processing system is used to process user data bits 202, store them in or transit them through a storage or transmission channel 208 and retrieve the user data bits 214 without introducing errors. User data 202 to be stored or transmitted is received by an encoding system with a low density parity check encoder with miscorrection support 204. The encoding system with a low density parity check encoder with miscorrection support 204 encodes the user data 202 in the low density parity check encoder based on a generator G matrix, including computing a hash value for the special layer S of a parity check H matrix. The encoding system with a low density parity check encoder with miscorrection support 204 yields encoded data 206 with the hash value included as extra parity bits. The encoded data 206 is stored or transmitted in a storage/transmission channel 208, such as, but not limited to, a magnetic hard drive or wireless radio signal. Encoded data 210 is retrieved from the storage/transmission channel 208 and is decoded by a decoding system with low density parity check decoder with miscorrection handling 212. The decoding system with low density parity check decoder with miscorrection handling 212 applies a low density parity check decoding algorithm to the retrieved encoded data 210. If the data converges and the syndrome is 0, yet other tests indicate a miscorrection, the decoding system with low density parity check decoder with miscorrection handling 212 applies either or both the inner level and outer level of miscorrection handling to yield decoded user data 214.

Turning to FIG. 3, an encoding system including a low density parity check encoder with miscorrection support 304 is depicted in accordance with one or more embodiments of the present invention, suitable for use in some embodiments in place of the encoding system with a low density parity check encoder with miscorrection support 204 of FIG. 2. User data 302 is processed by a channel cyclic redundancy check encoder 316 which generates cyclic redundancy check bits 318 for the user data 302. The cyclic redundancy check bits 318 are added to the user data 302 by a multiplexer 320 or in any other suitable manner, yielding user data with channel cyclic redundancy check bits 322. The user data with channel cyclic redundancy check bits 322 is encoded in some embodiments by a pattern constraint encoder 324, preparing the user data with channel cyclic redundancy check bits 322 for storage or transmission so that errors are reduced. The pattern constraint encoder 324 may apply, but is not limited to, a pattern constraint such as a maximum transition run (MTR), run length limiting (RLL) or other constraints. Based upon the disclosure provided herein, one of ordinary skill in the art will recognize a variety of pattern constraint encoders that may be used in relation to different embodiments of the present invention.

Encoded user bits 326 from the pattern constraint encoder 324 are encoded in a low density parity check decoder with miscorrection support 330. The low density parity check decoder with miscorrection support 330 applies a low density parity check encoding algorithm based on a generator matrix G corresponding to an H matrix with a sub-matrix $H_0$ and special layer S, including calculating hash values for the generator matrix G and including them as extra parity bits for the special layer S. In some embodiments, the hash values are calculated in the low density parity check decoder with miscorrection support 330 using a cyclic redundancy check algorithm. The low density parity check decoder with miscorrection support 330 provides a data field 332 and parity field 334 to a parity insertion circuit 338 which inserts parity bits from the parity field 334 into the data bits from the data field 332 according to the generator matrix G, yielding encoded data 306.

By calculating the hash values after the pattern constraint encoding in pattern constraint encoder 324, the encoded data 306 may violate the pattern constraints. However, the hash restores the linearity property hash to be used in the outer level of miscorrection handling so that small codewords can be retrieved and used to correct a miscorrected codeword. The hash values may thus include a small number of bits, such as but not limited to 24 or 32 hash bits, that do not receive the pattern constraint encoding, but this provides the benefits of the linearity property hash, including that the low density parity check decoder need not test every small codeword to correct a miscorrected codeword. If a regular cyclic redundancy check such as a CRC-32 algorithm were performed, expanding user bits by embedding the extra 32 bits in the user data before pattern constraint encoding, the property of linearity would be lost as the additional bits passed through the pattern constraint encoder 324. When the hash value retains the property of linearity, the codeword can be edited based only on the values of their hash or cyclic redundancy check, without costly recomputation of the cyclic redundancy check values for the edited words.

Turning to FIG. 4, a decoding system including a low density parity check decoder with miscorrection handling 412 is depicted in accordance with one or more embodiments of the present invention. Decoding system 412 includes an analog front end circuit 440 that receives analog encoded data 410, an analog signal corresponding to encoded data 306 as it is retrieved from a storage device or transmission medium. Analog front end circuit 440 processes analog encoded data 410 and provides a processed analog signal to an analog to digital converter circuit 442. Analog front end circuit 442 may include, but is not limited to, an analog filter and an amplifier circuit as are known in the art. Based upon the disclosure provided herein, one of ordinary skill in the art will recognize a variety of circuitry that may be included as part of analog front end circuit 440. In some embodiments, analog encoded data 410 is derived from a read/write head assembly (not shown) that is disposed in relation to a storage medium (not shown). In other embodiments, analog encoded data 410 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog encoded data 410 may be derived.

Analog to digital converter circuit 442 converts the processed analog signal into a corresponding series of digital samples. Analog to digital converter circuit 442 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. The digital samples are provided to an equalizer circuit 444. Equalizer circuit 444 applies an equalization algorithm to the digital samples to yield an equalized output. In some embodiments of the present invention, equalizer circuit 444 is a digital finite impulse response filter circuit as are known in the art. In some cases, equalizer circuit 444 includes sufficient memory to maintain one or more codewords until a data detector circuit 446 is available for processing, and for multiple processes through data detector circuit 446.

Data detector circuit 446 is operable to apply a data detection algorithm to a received codeword or data set, and in some cases data detector circuit 446 can process two or more codewords in parallel. In some embodiments of the present invention, data detector circuit 446 is a Viterbi algorithm data detector circuit as are known in the art. In other embodiments of the present invention, data detector circuit 446 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 446 is started based upon availability of a data set from equalizer circuit 444 or from a central memory circuit 450.

Upon completion, data detector circuit 446 provides a detector output which includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output is provided to a local interleaver circuit 448. Local interleaver circuit 448 is operable to shuffle sub-portions (i.e., local chunks) of the data set included as detected output and provides an interleaved codeword that is stored to central memory circuit 450. Local interleaver circuit 448 may be any circuit known in the art that is capable of shuffling data sets to yield a re-arranged data set.

Once a low density parity check decoder with miscorrection handling 454 is available, a previously stored interleaved codeword is accessed from central memory circuit 450 as a stored codeword and globally interleaved by a global interleaver/deinterleaver circuit 452. Global interleaver/deinterleaver circuit 452 may be any circuit known in the art that is capable of globally rearranging codewords. Global interleaver/deinterleaver circuit 452 provides a decoder input to low density parity check decoder with miscorrection handling 454.

The low density parity check decoder with miscorrection handling 454 applies a low density parity check decoding algorithm to the decoder input to yield a decoded output 460. If the data converges in the low density parity check decoder with miscorrection handling 454, producing a syndrome of 0, one or more miscorrection tests are performed on the resulting codeword in the low density parity check decoder with miscorrection handling 454 to determine if it was miscorrected. If a miscorrection is detected, the low density parity check decoder with miscorrection handling 454 performs one or more of the inner level and outer level of miscorrection handling so that the decoded output 460 is correct.

In the inner level of miscorrection handling, the special layer S 462 is used to perform extra low density parity check decoding based on the full H matrix 102. In other words, the low density parity check decoding algorithm is performed on the full H matrix 102 rather than on only the sub-matrix $H_0$, so that the decoded output 460 is a codeword based on the full H matrix 102.

In the outer level of miscorrection handling, a hash value computed based on the special layer S is used to look up corresponding small codewords that are combined with the codeword from the main low density parity check decoding. Thus, the codeword in the decoded output 460 is combined with small codewords from a lookup table or list of small codewords 464. The codeword in the decoded output 460 or the corrected codeword is stored in a hard decision queue 466. Notably, although the special layer S 462 and list of small codewords 464 are depicted outside of the low density parity check decoder with miscorrection handling 454 to illustrate the operation of the inner level and outer level of miscorrection handling, in some embodiments both levels of miscorrection handling are performed internally in the low density parity check decoder with miscorrection handling 454.

The codeword in the hard decision queue 466 is processed by a parity removal circuit 468 to remove the parity bits, yielding data bits which are decoded in a pattern constraint decoder 470. The pattern constraint decoder 470 reverses the encoding performed by the pattern constraint encoder 324 in the encoding system 304. A channel cyclic redundancy check 472 is performed on the resulting decoded bits. If an error is detected, a correction is made to the codeword stored in the hard decision queue 466 using a list of small codewords for cyclic redundancy check correction 474. In other embodiments, other external data check and correction techniques may be applied in place of the channel cyclic redundancy check 472. Based upon the disclosure provided herein, one of ordinary skill in the art will recognize a variety of data integrity checks and correction algorithms that could be used in relation to different embodiments of the present invention. Once the channel cyclic redundancy check 472 is satisfied, the decoded user data 414 is output from the decoding system 412.

Where the data decoding algorithm as applied by low density parity check decoder with miscorrection handling 454 failed to converge and no more local iterations (iterations through low density parity check decoder with miscorrection handling 454) are allowed, soft decoder output from low density parity check decoder with miscorrection handling 454 is transferred back to central memory circuit 450 via global interleaver/deinterleaver circuit 452. Prior to storage of the soft decoded output to central memory circuit 450, the soft decoded output is globally deinterleaved to yield a globally deinterleaved output that is stored to central memory circuit 450. The global deinterleaving reverses the global interleaving earlier applied to the stored codeword to yield the decoder input. Once data detector circuit 446 is available, a previously stored deinterleaved output is accessed from central memory circuit 450 and locally deinterleaved by a local deinterleaver circuit 456. Local deinterleaver circuit 456 rearranges the soft decoder output to reverse the shuffling originally performed by local interleaver circuit 448. A resulting deinterleaved output is provided to data detector circuit 446 where it is used to guide subsequent detection of a corresponding data set received as equalized output from equalizer circuit 444.

Figure 5:
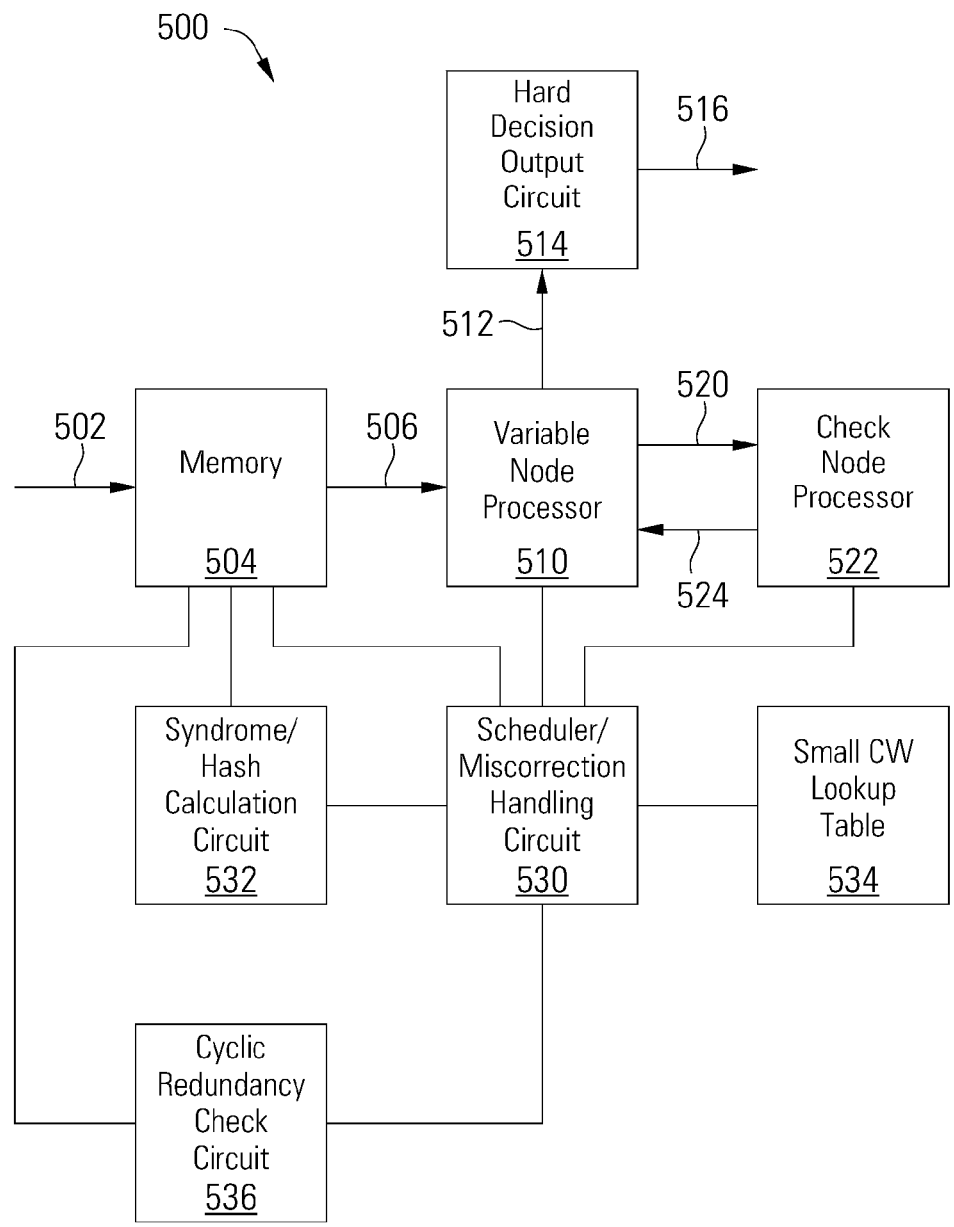
FIG. 5 depicts a block diagram of a low density parity check decoder with miscorrection handling in accordance with some embodiments of the present invention.

Turning to FIG. 5, a low density parity check decoder with miscorrection handling 500 is depicted in accordance with some embodiments of the present invention. The low density parity check decoder with miscorrection handling 500 is not limited to any particular algorithm for parity check calculations or message generation techniques. In the low density parity check decoder with miscorrection handling 500, data bits or symbols are stored in variable nodes as they are decoded, and parity checks are performed in a number of check nodes. The connections (or edges) between variable nodes and check nodes are selected as the low density parity check code is designed. Non-zero elements in the H matrix represent a connection between a variable node and check node, where columns represent variable nodes, rows represent check nodes, and for a non-binary decoder, a random non-zero element from the Galois Field at the intersection of a variable node column and a check node row indicates a connection between that variable node and check node and provides a permutation for messages between that variable node and check node. Messages are passed between connected variable nodes and check nodes in an iterative process, passing beliefs about the values that should appear in variable nodes to connected check nodes. Parity checks are performed in the check nodes based on the messages and the results are returned to connected variable nodes to update the beliefs if necessary. Messages in a non-binary low density parity check decoder are multi-dimensional vectors, generally either plain-likelihood probability vectors or log likelihood ratio vectors.

Input data 502 to the low density parity check decoder with miscorrection handling 500 is stored in a memory 504. Input data 502 includes soft values representing variable node value probabilities. Probability values 506 from memory 504 are provided to a variable node processor 510, which generates variable node to check node messages 520 containing probability values for the perceived value of each bit or symbol. A check node processor 522 receives the variable node to check node messages 520 and performs parity check calculations for each check node based on messages from connected variable nodes. The check node processor 522 also generates check node to variable node messages 524, enabling the variable node processor 310 to update the perceived value for each variable node based on check node to variable node messages 524 from connected check nodes.

In a min-sum based low density parity check decoder, the check node processor 522 selects the lowest (or minimum) log likelihood ratio values and feeds them back to the connected variable nodes with sign adjustment. Updated variable node values may also be updated in the memory 504 during local decoding iterations, either by the variable node processor 510 or check node processor 522 or both. Probability values 512 from the variable node processor 510 may also be provided to a hard decision output circuit 514 which generates a hard decision output 516.

A scheduler and miscorrection handling circuit 530 in the low density parity check decoder 500 controls the processing of the H matrix in the low density parity check decoder 500, such as, but not limited to, controlling the order of check node to variable node and variable node to check node message generation, parity checks and variable node updates, and initially causing the variable node processor 510 and check node processor 522 to decode the input data 502 using only the sub-matrix $H_0$. The scheduler and miscorrection handling circuit 530 also implements the miscorrection handling.

A syndrome and hash calculation circuit 532 calculates the syndrome by multiplying the hard decision outcome V of the low density parity check decoding for the parity check matrix $H_0$ by the sub-matrix $H_0$, and calculates the hash value by multiplying the hard decision outcome of the low density parity check decoding for the special layer S by the special layer S. Thus, the hash value is calculated in the same manner as the syndrome, with the syndrome calculated based on the sub-matrix $H_0$ 104, excluding the special layer S 106, and with the hash value calculated based on the special layer S 106, excluding the sub-matrix $H_0$ 104. The syndrome and hash calculation circuit 532 may be implemented as independent circuits or as a combined circuit containing syndrome and hash calculation circuits.

After the initial decoding of the input data 502 using only the sub-matrix $H_0$, if the syndrome calculated by the syndrome and hash calculation circuit 532 is 0, indicating that the data has converged, the syndrome and hash calculation circuit 532 calculates the hash and the scheduler and miscorrection handling circuit 530 determines whether the hash is 0. If the hash is not zero, the scheduler and miscorrection handling circuit 530 implements the inner level of miscorrection handling, causing the variable node processor 510 and check node processor 522 to repeat the decoding of the input data 502 using the entire H matrix 102. In some embodiments, if the hash is zero after the initial decoding, a cyclic redundancy check circuit 536 performs a cyclic redundancy check on external cyclic redundancy check bits incorporated into the user bits by the encoder, and if the cyclic redundancy check fails, a miscorrection is identified and the scheduler and miscorrection handling circuit 530 implements the inner level of miscorrection handling. In some embodiments, other error correction techniques are combined with the miscorrection handling, such as but not limited to targeted symbol flipping.

After the decoding of the input data 502 has been repeated using the entire H matrix 102 and the syndrome is again 0, the miscorrection test is repeated by the scheduler and miscorrection handling circuit 530 based on the hash value calculated by the syndrome and hash calculation circuit 532, and in some embodiments, based on a cyclic redundancy check. If a miscorrection is again identified, the scheduler and miscorrection handling circuit 530 implements the outer level of miscorrection handling, using the hash calculated by the syndrome and hash calculation circuit 532 during the inner level of miscorrection handling to look up a small codewords associated with the hash. If a small codeword is found, the miscorrected codeword is corrected by combining the small codeword with the miscorrected codeword in an XOR operation to yield a corrected codeword.

Figure 6:
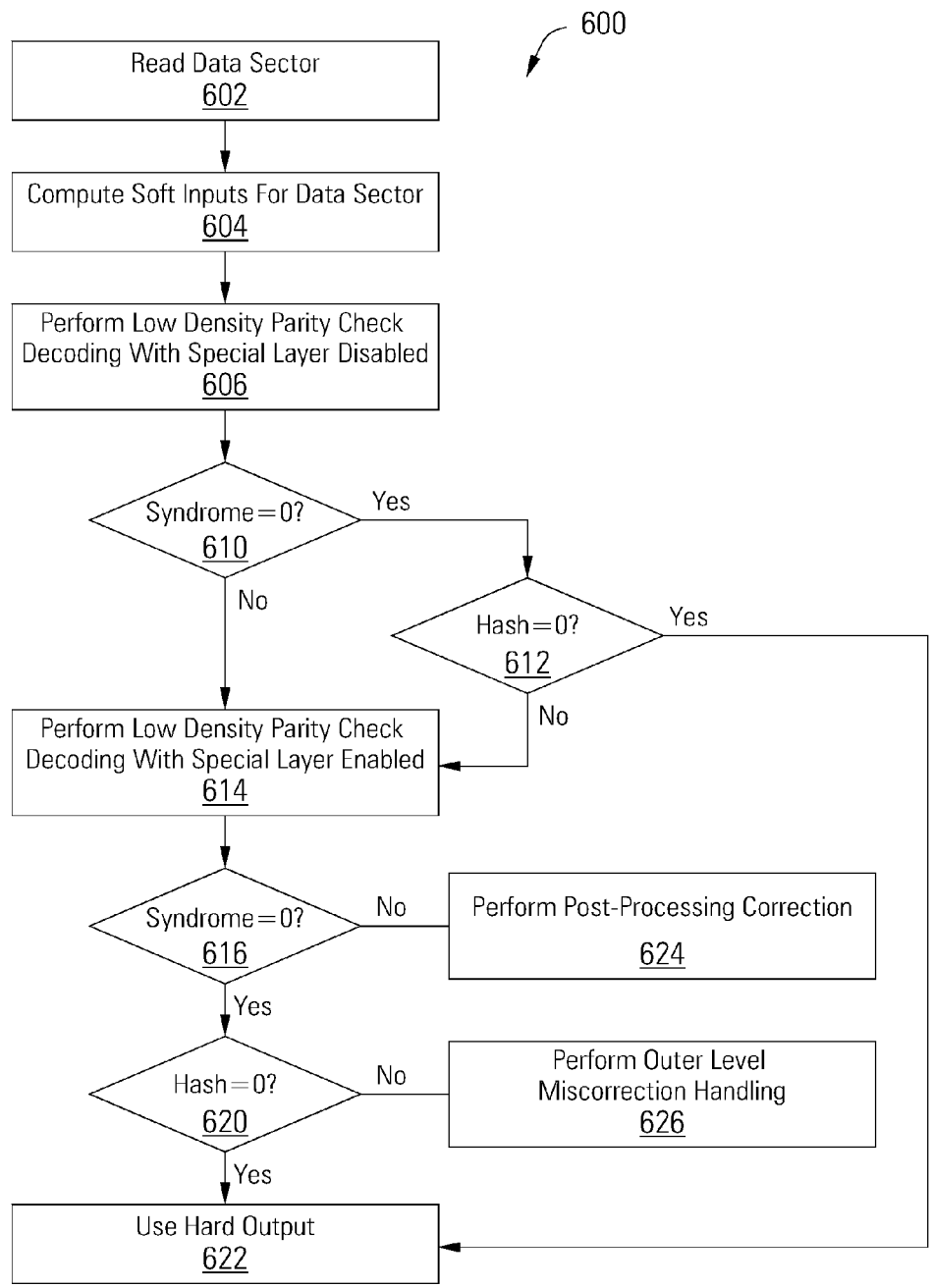
FIG. 6 depicts a flow diagram showing a method for inner level miscorrection handling during low density parity check decoding in accordance with various embodiments of the present invention.

Turning to FIG. 6, a flow diagram 600 depicts an operation for inner level miscorrection handling in accordance with some embodiments of the present invention. Following flow diagram 600, a data sector is read. (Block 602) In some embodiments, the data sector is read by a read/write head assembly that is disposed in relation to a magnetic storage medium. In other embodiments, the data sector is derived from a receiver circuit that is operable to receive a signal from a transmission medium. Soft inputs for the data sector are computed. (Block 604) In some embodiments, this is performed by a data detector such as a Viterbi detector or a maximum a posteriori data detector circuit. Low density parity check decoding is performed on the data sector soft inputs, with the special layer in the parity check H matrix disabled. (Block 606) A determination is made as to whether the resulting syndrome is 0. (Block 610) The syndrome is calculated by multiplying the hard decision outcome of the low density parity check decoding with the special layer disabled by the sub-matrix $H_0$. If the syndrome is 0, a determination is made as to whether the resulting hash is 0. (Block 612) The hash is calculated by multiplying the hard decision outcome for the special layer by the special layer. If the hash is 0 as determined in Block 612, in some embodiments the codeword produced by the low density parity check decoding with the special layer disabled is deemed correct and the hard decision output for the codeword is used. (Block 622) If the hash is not 0 as determined in Block 612 or if the syndrome is not 0 as determined in Block 610, the low density parity check decoding is repeated on the data sector soft inputs, with the special layer in the parity check H matrix enabled. (Block 614) Another determination is made as to whether the resulting syndrome is 0. (Block 616) If the syndrome is not 0 as determined in Block 616 after the allowed number of local and global decoding iterations, the data has failed to converge and post-processing correction may be performed. (Block 624) Such post-processing correction may include any type of data correction or error recovery techniques, such as targeted symbol flipping. If post-processing correction is not successful or is not available, decoding has failed. If the syndrome is 0 as determined in Block 616, a determination is made as to whether the resulting hash is 0. (Block 620) If the hash is 0, the decoding is deemed successful and the hard decision output for the codeword is used. (Block 622) If the hash is not 0, outer level miscorrection handling is performed. (Block 626) In other embodiments, the miscorrection is identified in Blocks 612 and 620 based on an external test such as, but not limited to, a cyclic redundancy check as well as the hash value.

Figure 7:
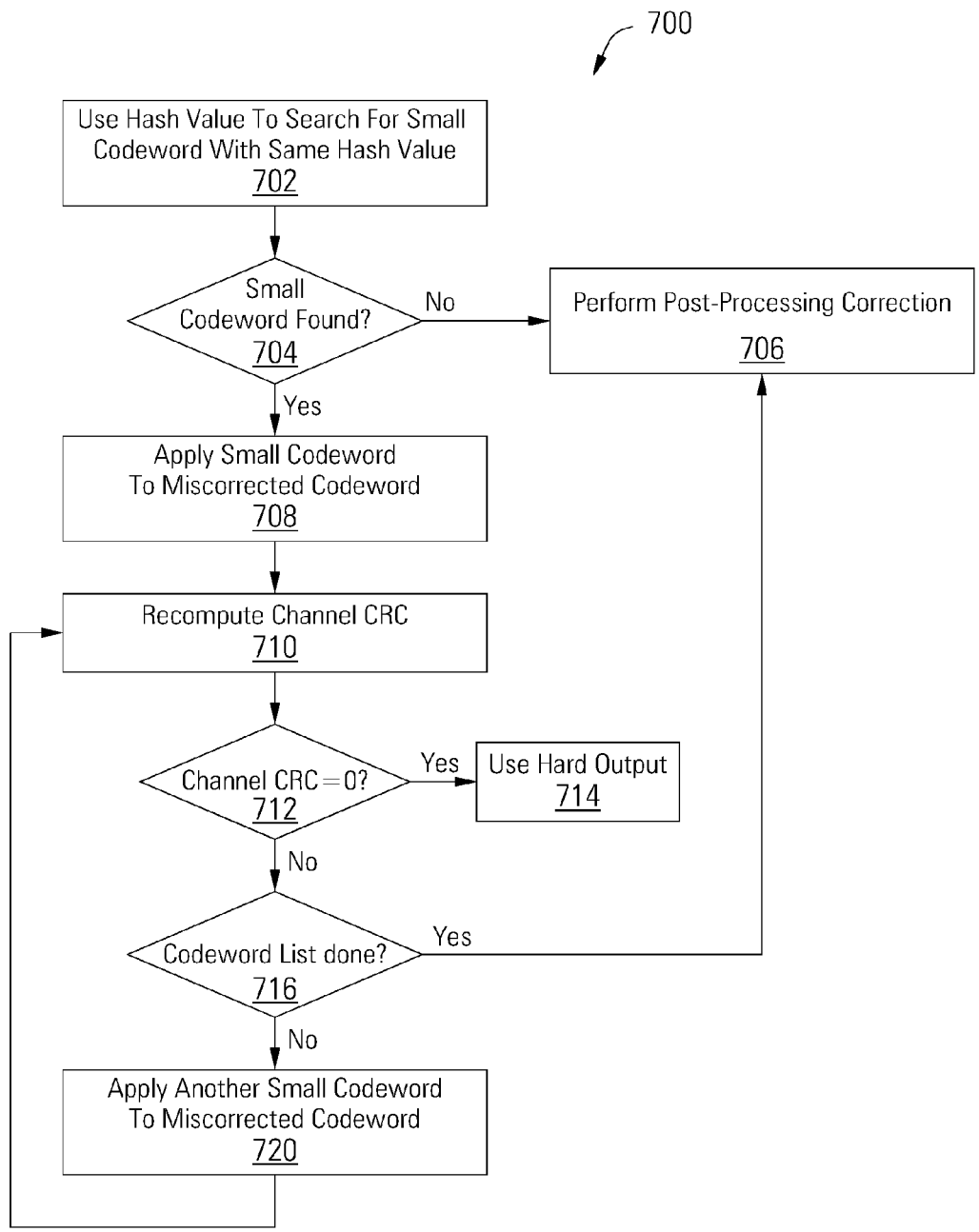
FIG. 7 depicts a flow diagram showing a method for outer level miscorrection handling during low density parity check decoding in accordance with various embodiments of the present invention.

Turning to FIG. 7, a flow diagram 700 depicts an operation for outer level miscorrection handling in accordance with some embodiments of the present invention. Following flow diagram 700, the hash value is used to search for a small codeword with the same hash value. (Block 702) Block 702 is performed using the pre-computed list of small codewords for the sub-matrix $H_0$ along with their corresponding hash values. Again, the hash value generated in the low density parity check decoder is calculated by multiplying the hard decision outcome for the special layer by the special layer. The small codeword is searched for in a lookup table in which small codewords are stored in pairs with their corresponding hash value, pre-computed at design time for the special layer S of the parity check matrix H. A determination is made as to whether a small codeword with a matching hash value is found. (Block 704) If not, the outer level miscorrection handling has failed because no small codeword is available to correct the miscorrected codeword, and post-processing correction is performed. (Block 706) Such post-processing correction may include any type of data correction or error recovery techniques, such as targeted symbol flipping. If post-processing correction is not successful or is not available, decoding has failed.

If a small codeword is found using the hash value computed in the low density parity check decoder as determined in Block 704, the small codeword is applied to the miscorrected codeword. (Block 708) In some embodiments, this is achieved by combining the small codeword with the miscorrected codeword in an XOR operation. The channel cyclic redundancy check is recomputed. (Block 710) A determination is made as to whether the channel cyclic redundancy check is satisfied. (Block 712) If it is, the corrected codeword is deemed correct and the hard decision output for the corrected codeword is used. (Block 714) If the channel cyclic redundancy check is not satisfied, a determination is made as to whether the list of small codewords for the full matrix H has all been tried. (Block 716) If so, the outer level miscorrection handling has failed because no small codeword is available to correct the miscorrected codeword, and post-processing correction is performed. (Block 706) If additional small codewords remain to be tried, another small codeword is selected and applied to the miscorrected codeword. (Block 720) The channel cyclic redundancy check is recomputed (Block 710) and the operation continues while small codewords remain to try to correct the miscorrected codeword. Blocks 716 and 720 are performed using the pre-computed compressed list of small codewords for full parity check matrix H.

Figure 8:
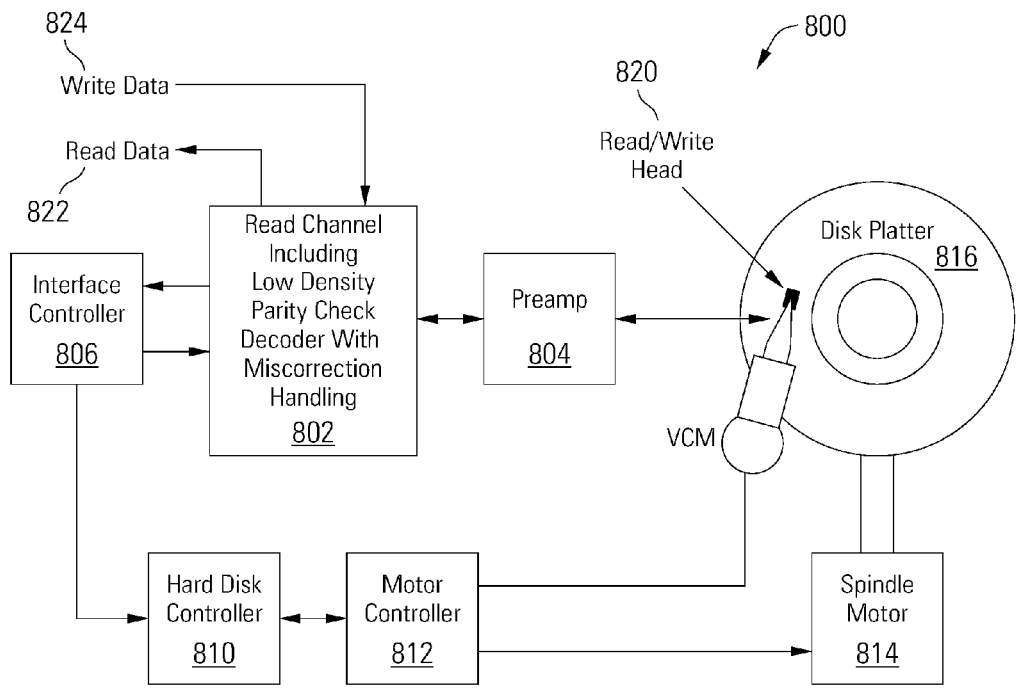
FIG. 8 depicts a storage system including a low density parity check decoder with miscorrection handling in accordance with some embodiments of the present invention.
Figure 9:
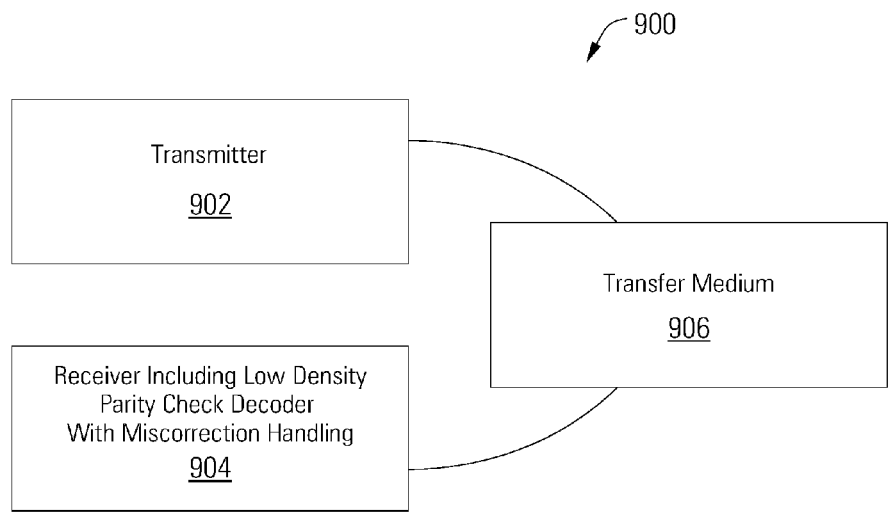
FIG. 9 depicts a wireless communication system including a low density parity check decoder with miscorrection handling in accordance with some embodiments of the present invention.

Although the low density parity check decoder with miscorrection handling disclosed herein is not limited to any particular application, several examples of applications are presented in FIGS. 8 and 9 that benefit from embodiments of the present invention. Turning to FIG. 8, a storage system 800 is illustrated as an example application of a low density parity check decoder with miscorrection handling in accordance with some embodiments of the present invention. The storage system 800 includes a read channel circuit 802 with a low density parity check decoder with miscorrection handling in accordance with some embodiments of the present invention. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head assembly 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. As part of processing the received information, read channel circuit 802 performs a data decoding process on the received signal using a low density parity check decoder with miscorrection handling. Such a low density parity check decoder with miscorrection handling may be implemented consistent with the disclosure above in relation to FIGS. 1-5. In some cases, the data decoding with miscorrection handling may be performed consistent with the flow diagrams disclosed above in relation to FIGS. 6-7. A write operation is substantially the opposite of the preceding read operation with write data 824 being provided to read channel circuit 802 and written to disk platter 816.

It should be noted that storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 9, a wireless communication system 900 or data transmission device including a transmitter 902 and receiver 904 with a low density parity check decoder with miscorrection handling is shown in accordance with some embodiments of the present invention. Communication system 900 includes a transmitter 902 that is operable to transmit encoded information via a transfer medium 906 as is known in the art. The encoded data is received from transfer medium 906 by receiver 904. Receiver 904 incorporates a low density parity check decoder with miscorrection handling. Such a low density parity check decoder with miscorrection handling may be implemented consistent with the disclosure above in relation to FIGS. 1-5. In some cases, the data decoding with miscorrection handling may be performed consistent with the flow diagrams disclosed above in relation to FIGS. 6-7.

Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as dynamic random-access memory, negated-AND flash, negated-OR flash, other non-volatile memories and solid state drives.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses and methods for low density parity check decoding with miscorrection handling. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
a decoder circuit operable to apply a decoding algorithm to a decoder input based on a first portion of a composite matrix to yield a codeword;
a syndrome calculation circuit operable to calculate a syndrome based on the codeword and on the first portion of the composite matrix; and
a hash calculation circuit operable to calculate a hash based on a second portion of the composite matrix, wherein the decoder circuit is operable to correct the codeword based at least in part on the hash when the syndrome indicates that the codeword based on the first portion of the composite matrix is correct but a second test indicates that the codeword is miscorrected.

2. The data processing system of claim 1, wherein the decoder circuit comprises a low density parity check decoder and the composite matrix comprises a parity check matrix.

3. The data processing system of claim 1, further comprising a miscorrection handling circuit operable to cause the decoder circuit to correct the codeword by reapplying the decoding algorithm to the decoder input based on the entire composite matrix.

4. The data processing system of claim 1, wherein the second test comprises comparing the hash with an expected value.

5. The data processing system of claim 1, wherein the second test comprises a cyclic redundancy check comparing cyclic redundancy check bits calculated based on the codeword with source cyclic redundancy check bits in the decoder input.

6. The data processing system of claim 1, further comprising a miscorrection handling circuit operable to correct the codeword with the decoder circuit by searching for a sub-codeword using the hash and combining the sub-codeword with the codeword.

7. The data processing system of claim 6, wherein the miscorrection handling circuit is operable to search for the sub-codeword in a lookup table of sub-codeword and hash value pairs using the hash.

8. The data processing system of claim 6, wherein the miscorrection handling circuit is operable to determine whether combining the sub-codeword with the codeword corrects the miscorrected codeword by comparing a resulting codeword from combining the sub-codeword with the codeword with an expected value.

9. The data processing system of claim 6, wherein the miscorrection handling circuit is operable to determine whether combining the sub-codeword with the codeword corrects the miscorrected codeword using a cyclic redundancy check.

10. The data processing system of claim 1, further comprising a low density parity check encoder circuit operable to encode input data based on a parity generator matrix corresponding to the composite matrix.

11. The data processing system of claim 10, further comprising a pattern constraint encoder operable to encode the input data to preclude unwanted data patterns, wherein the decoder input is derived from an output of the low density parity check encoder, wherein the low density parity check encoder circuit is operable to generate parity bits corresponding to the second portion of the composite matrix, and wherein the parity bits are provided to the decoder circuit without passing through the pattern constraint encoder.

12. The data processing system of claim 1, wherein parity bits in the decoder input corresponding to the second portion of the composite matrix satisfy a linearity property.

13. The data processing system of claim 1, wherein the data processing system is implemented as part of a device selected from a group consisting of a storage device and a receiving device.

14. The data processing system of claim 1, wherein the data processing system is implemented as an integrated circuit.

15. A method of decoding data, comprising:
applying a decoding algorithm in a decoder circuit to the data based on a first portion of a composite matrix to yield a codeword;
multiplying the codeword and the first portion of the composite matrix in a syndrome calculation circuit to yield a syndrome;
applying the decoding algorithm in the decoder circuit to the data based on a second portion of the composite matrix to yield a second codeword;
multiplying the second codeword and the second portion of the composite matrix in a hash calculation circuit to yield a hash; and
correcting the codeword based at least in part on the hash when the syndrome indicates that the codeword is correct but a second test indicates that the codeword is miscorrected.

16. The method of claim 15, wherein the codeword is corrected by reapplying the decoding algorithm to the data based on the entire composite matrix when the syndrome indicates that the codeword is correct but a second test indicates that the codeword is miscorrected.

17. The method of claim 15, wherein the codeword is corrected by searching for a sub-codeword in a lookup table of sub-codeword and hash value pairs using the hash and combining the sub-codeword with the codeword in an exclusive OR operation.

18. The method of claim 17, further comprising testing the corrected codeword with a cyclic redundancy check.

19. The method of claim 15, wherein the second test comprises comparing the hash with an expected value.

20. A storage system comprising:
a storage medium;
a head assembly disposed in relation to the storage medium and operable to provide a sensed signal corresponding to information on the storage medium;
a data processing system comprising:
an analog to digital converter circuit operable to sample an analog signal derived from the sensed signal to yield a series of digital samples;
an equalizer circuit operable to equalize the digital samples to yield a data set;
a data detector circuit operable to apply a data detection algorithm to the data set to yield a detected output; and
a data decoding circuit including:
a decoder operable to apply a decoding algorithm to the detected output based on a first portion of a composite matrix to yield a codeword;
a syndrome calculation circuit operable to calculate a syndrome based on the codeword and on the first portion of the composite matrix; and
a hash calculation circuit operable to calculate a hash based on a second portion of the composite matrix, wherein the decoder is operable to correct the codeword based at least in part on the hash when the syndrome indicates that the codeword based on the first portion of the composite matrix is correct but a second test indicates that the codeword is miscorrected.

* * * * *